April 8, 1969 R. D. SHATTUCK 3,437,818

PROTECTION OF SERIALLY CONNECTED SOLAR CELLS AGAINST OPEN CIRCUITS BY THE USE OF SHUNTING DIODE

Filed Oct. 19, 1966

INVENTOR
RUSSELL D. SHATTUCK

BY

A Hume & Coy
Gene E. Shook
ATTORNEYS 3,437,818

PROTECTION OF SERIALLY CONNECTED SOLAR CELLS AGAINST OPEN CIRCUITS BY THE USE OF SHUNTING DIODE

Russell D. Shattuck, Bay Village, Ohio, assignor to the United States of America as represented by the Administrator of the National Aeronautics and Space Administration Filed Oct. 19, 1966, Ser. No. 588,671
Int. Cl. H01j 39/12
U.S. Cl. 250—212 5 Claims

ABSTRACT OF THE DISCLOSURE

Maintaining current flow through an array of serially connected solar cells even though the array has some open connections. All junctions are shunted by at least one protecting diode, and each connection has at least one completely redundant shunting diode.

The invention described herein was made by an employee of the United States Government and may be manufactured and used by or for the Government for governmental purposes without the payment of any royalties thereon or therefor.

This invention relates to an improved serial connection for solar cells in an array. The invention is particularly concerned with maintaining current flow through the solar cells even though some open connections are in the array.

A power supply for equipment which is used in space frequently utilizes an array in which a number of solar cells are connected in series. Such an array presents a problem of open connections occurring between some of the cells.

Some protection may be obtained by connecting a diode across a cell-to-cell connection. The diode provides an alternate path for current flow to insure the operation of the series string when an open connection occurs between the cells. The difficulty resulting from such a connection is that because the most common solar cell failure is a contact break the protecting diode contacts may open at the same time a cell-to-cell contact fails.

These problems and difficulties have been solved by the present invention in which the diodes are staggered in such a manner that each diode is protecting more than one solar cell junction. This is accomplished by having each diode connected as a shunt across two, three, or more cells. In this manner every connection is shunted by at least one protecting diode, and the number of protecting diodes per solar cell connection may be increased. The number of protecting diodes is limited only by the magnitude of the allowable output degradation in the system because the failure of any one series cell connection would lead to a loss of output from all the cells being shunted by the particular diode involved.

It is, therefore, an object of the present invention to provide a solar cell array having improved electrical connections which maintain current flow even though some of the electrical contacts are broken.

Another object of the invention is to provide improved connections through which current flow is maintained in a series string of solar cells with a minimum loss of power where there are open connections between some of the cells in the series.

Still another object of the invention is to provide a solar cell array in which every connection between the cells is shunted by at least one protecting diode.

These and other objects of the invention will be apparent from the specification which follows and from the drawing in which like numerals are used throughout to identify like parts.

Figure 1:
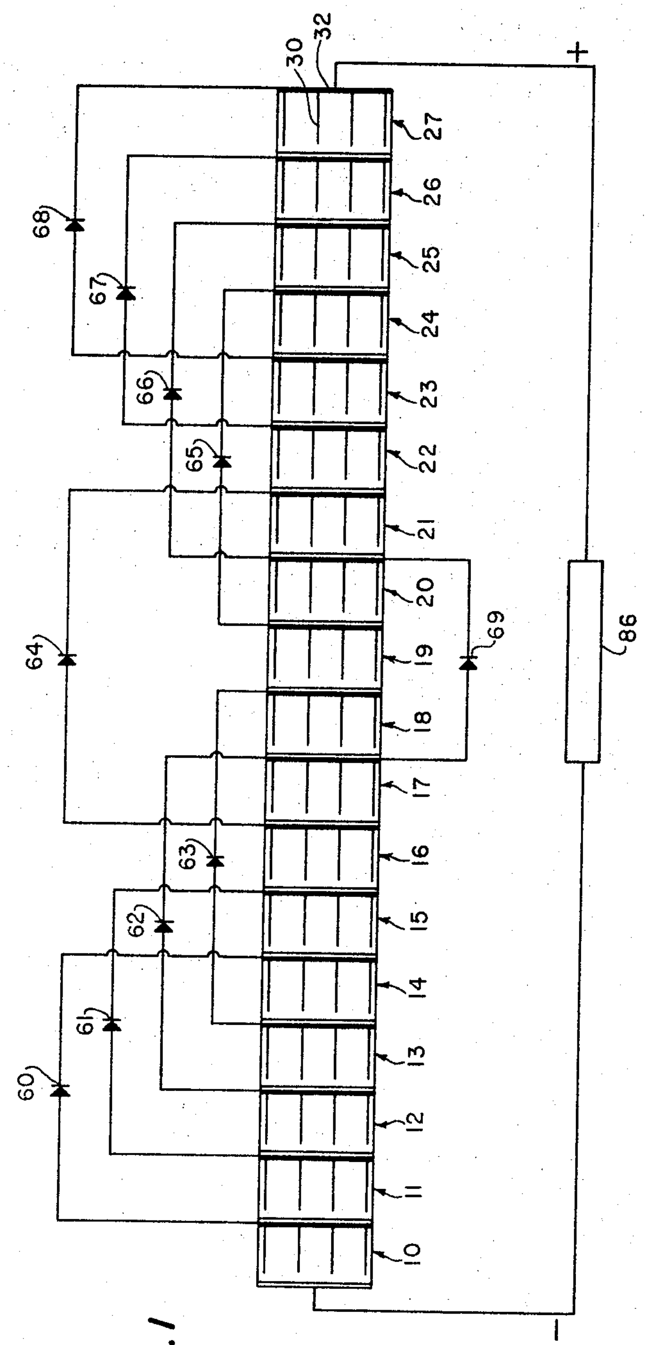
FIG. 1 is a plan view of an array of solar cells connected in accordance with the present invention.
Figure 2:
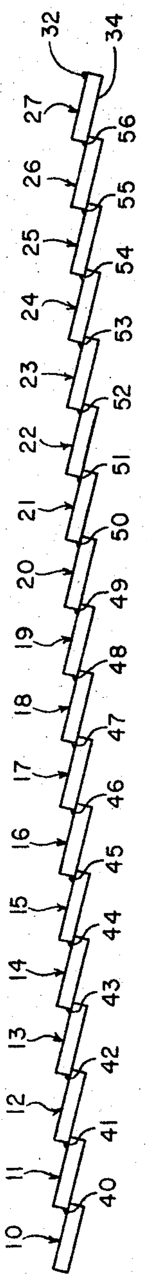
FIG. 2 is an elevation view of the array shown in FIG. 1.

Referring now to the drawing, there is shown in FIGS. 1 and 2 a group of solar cells 10–27 which may be of the P on N type. Each cell as a grid 30 which is secured to one of its faces. The grid 30 terminates at a P contact 32 across one end as best seen in FIG. 2. An N contact 34 covers the entire surface of each solar cell opposite the grid 30.

The cells 10–27 are mounted in a straight line array by placing each P contact 32 in engagement with the N contact 34 of an adjacent cell and soldering the resulting joint. In this manner the cells 10–27 are connected in series at junctions 40–56 respectively. The array is used to supply current to a load 86 such as a battery which is charged by the array.

An open connection between any adjacent cells 10–27 at a junction 40–56 of the P and N contacts prevents passage of current directly through the array shown in FIGS. 1 and 2 because the cells are connected in series. If a diode is connected across each cell-to-cell connection the series strip is maintained in operation at a reduced power level because the diode provides an alternate path for the current. However, the protecting diode may not operate in its intended fashion because the most common solar cell failure is a contact failure, and the protecting diode contact fails at the same time the cell-to-cell contact is broken. By way of illustration, a diode connected between junctions 43 and 44 would form a shunt around the solar cell 14. A break in either of these junctions would probably cause an interruption in this shunt. This is likewise true for any diode that forms a shunt between adjacent junctions around one of the solar cells in the array.

According to the present invention, diodes 60–69 are used to protect the junctions 40–56. As seen in FIG. 1, each diode protects more than one junction. By way of example, the diode 60 forms a shunt across the junctions 40 and 44. An open connection at any or all of junctions 41, 42 and 43 would cause current to flow through the diode 60 between the solar cells 10 and 15.

In a like manner, the diode 64 protects junctions 47, 48, 49 and 50 because an open connection at any of these junctions causes current to flow through this diode. The diode 68 forms a shunt between the junction 53 and the P contact 32 at the end of the strip.

As shown in FIG. 1 all the junctions 40 to 56 are shunted by at least one protecting diode. There is no cell-to-cell connection which does not have at least one completely redundant shunting diode, and some junctions have two spares. For example, an open connection at junction 43 would cause current to flow through diodes 60, 61 and 62. In a similar manner, an open connection at junction 54 would cause current to flow through diodes 66, 67 and 68. The diode 69 is connected between junctions 47 and 50 to form a second shunt with diode 64 for protecting the center junctions 48 and 49.

While a preferred embodiment of the invention has been shown and described, it will be appreciated that various modifications may be made to the disclosed structure without departing from the spirit of the invention or the scope of the subjoined claims. For example, the improved connection can be used with a number of different types of solar cells as well as semiconductors where reliability is of paramount consideration.

What is claimed is:

1. In combination with a plurality of solar cells electrically connected in series at junctions between adjacent cells, the improvement comprising a plurality of diodes for protecting the solar cells against open connections at the junctions, and means for connecting each of said diodes as a shunt across at least two of the junctions between the cells thereby enabling current to flow through said diodes around an open connection at said two junctions.

2. Apparatus as claimed in claim 1 wherein the diodes are connected to the junctions in an overlapping manner so that each cell is protected by at least two diodes.

3. A space electrical power source comprising a plurality of solar cells, each having a grid secured to one of its faces terminating at a first contact across one end thereof and a second contact on the other face, said solar cells being mounted in a straight line array with each of said first contacts being in engagement with the second contact of an adjacent cell thereby forming a plurality of junctions between said solar cells, means for forming a shunt around each of said junctions so that an open connection at said junction causes current to flow through said shunt thereby maintaining current flow through said array, and a diode mounted in each of said shunts to prevent current flowing in the opposite direction through said junction.

4. A space power source as claimed in claim 3 wherein each diode shunts at least two junctions.

5. A space power source as claimed in claim 4 wherein the shunts are connected in an overlapping manner so that each cell is shunted by at least two diodes.

References Cited

UNITED STATES PATENTS 3,310,679 3/1967 Babish ............. 250—209

RALPH G. NILSON, *Primary Examiner.*

MARTIN ABRAMSON, *Assistant Examiner.*

U.S. Cl. X.R.

250—211